(12) United States Patent
Lee et al.

(10) Patent No.: US 12,334,140 B2
(45) Date of Patent: Jun. 17, 2025

(54) SEMICONDUCTOR MEMORY DEVICES HAVING ADJUSTABLE I/O SIGNAL LINE LOADING THAT SUPPORTS REDUCED POWER CONSUMPTION DURING READ AND WRITE OPERATIONS

(71) Applicant: Samsung Electronics Co., Ltd., Suwon-si (KR)

(72) Inventors: Seung-Jun Lee, Suwon-si (KR); Sang-Yun Kim, Suwon-si (KR); Jonghyuk Kim, Suwon-si (KR); Bok-Yeon Won, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 129 days.

(21) Appl. No.: 18/322,894

(22) Filed: May 24, 2023

(65) Prior Publication Data

US 2024/0105255 A1 Mar. 28, 2024

(30) Foreign Application Priority Data

Sep. 27, 2022 (KR) ........................ 10-2022-0122193

(51) Int. Cl.
*G11C 11/40* (2006.01)
*G11C 11/4074* (2006.01)
(Continued)

(52) U.S. Cl.
CPC ...... *G11C 11/4091* (2013.01); *G11C 11/4074* (2013.01); *G11C 11/4093* (2013.01)

(58) Field of Classification Search
CPC ............ G11C 11/4091; G11C 11/4074; G11C 11/4093
See application file for complete search history.

(56) References Cited

U.S. PATENT DOCUMENTS 7,924,595 B2 4/2011 Koo
8,363,497 B2 1/2013 Lee
(Continued)

FOREIGN PATENT DOCUMENTS

KR 100842743 B1 7/2008
KR 20090022322 A 3/2009
(Continued)

*Primary Examiner* — Han Yang
(74) *Attorney, Agent, or Firm* — Myers Bigel, P.A.

(57) ABSTRACT

A semiconductor memory device includes a memory bank arranged into first through nth split regions containing at least one memory cell sub-array within each split region, and first through nth global input/output (GIO) split lines electrically coupled to the first through nth split regions. First through n-1th connection control transistors are provided, which have gate terminals responsive to respective connection control signals. The first connection control transistor is configured to electrically short the first and second GIO split lines together when enabled by a corresponding connection control signal, and the n-1th connection control transistor is configured to electrically short the n-1th and nth GIO split lines together when enabled by a corresponding connection control signal. A GIO sense amplifier is provided, which is electrically coupled to the memory bank. A control circuit is provided, which is configured to reduce I/O signal line power consumption within the memory device during read (and write) operations.

20 Claims, 13 Drawing Sheets

(51) Int. Cl.
*G11C 11/4091* (2006.01)
*G11C 11/4093* (2006.01)

(56) References Cited

U.S. PATENT DOCUMENTS

| | | |
|---|---|---|
| 10,014,037 B2 | 7/2018 | Sohn |
| 10,957,382 B2 | 3/2021 | Derner et al. |
| 10,957,681 B1 | 3/2021 | Fujisawa et al. |
| 11,031,405 B2 | 6/2021 | Fardad et al. |
| 2015/0098274 A1* | 4/2015 | Rhie ................. G11C 16/0416 257/316 |
| 2016/0099047 A1* | 4/2016 | Lee .................... G11C 11/5642 365/185.03 |
| 2022/0005820 A1 | 1/2022 | Kim et al. |

FOREIGN PATENT DOCUMENTS

| | | |
|---|---|---|
| KR | 101090469 B1 | 12/2011 |
| KR | 20220005200 A | 1/2022 |

\* cited by examiner

SEMICONDUCTOR MEMORY DEVICES HAVING ADJUSTABLE I/O SIGNAL LINE LOADING THAT SUPPORTS REDUCED POWER CONSUMPTION DURING READ AND WRITE OPERATIONS

REFERENCE TO PRIORITY APPLICATION

This application claims priority to Korean Patent Application No. 10-2022-0122193, filed Sep. 27, 2022, the disclosure of which is hereby incorporated herein by reference.

BACKGROUND

The present invention relates to semiconductor devices and, more particularly, to semiconductor memory devices having enhanced power saving characteristics and methods of operating same.

Demands for expansion of storage capacity and reductions in layout area in memory devices continue to increase. To address these demands, the number of memory cells or sub-arrays electrically connected to global input/output (IO) signal lines is typically increased.

However, as the number of memory cells or sub-arrays electrically connected to each global 10 line is increased, the capacitive loading on the global input and output lines is also increased. Accordingly, there is a demand for semiconductor memory devices having improved power consumption characteristics associated with IO signal line operation.

SUMMARY OF THE INVENTION

The present invention provides semiconductor memory devices having reduced loading on global input and output (IO) signal lines and methods of operating the same.

According to an embodiment of the present invention, there is provided a semiconductor memory device including: (i) a memory bank, which is split into a first split region through a nth split region (each comprising a plurality of sub-arrays), (ii) a first connection control transistor through a n−1th connection control transistor, which are shared by an adjacent split region from among the first split region through the nth split region, and are turned on in response to a connection control signal, (iii) a first global input/output (GIO) split line through a nth GIO split line, which can be selectively connected to each other by the corresponding connection control transistors from among the first connection control transistor through the n−1th connection control transistor, and (iv) a GIO sense amplifier which receives and processes data read from a memory cell through the connected GIO split line from among the first GIO split line through the nth GIO split line.

In some embodiments, a memory cell region including the bank may be stacked on and overlap a peripheral circuit region, where the first connection control transistor through the n−1th connection control transistor are disposed, in a first direction. The memory cell region may also be formed on a first substrate, whereas the peripheral circuit region may be formed on a second substrate; the first substrate may be disposed at the upper part of the second substrate in the first direction. The first connection control transistor through the n−1th connection control transistor may be positioned between the adjacent split region from among the first split region through the nth split region.

According to additional embodiments, each of the first split region through the nth split region may further include a plurality of local sense amplifiers for sensing and amplifying data of corresponding sub-arrays from the plurality of sub-arrays by using a first driving voltage. In addition, the first GIO split line through the nth GIO split line may each be connected to the local sense amplifiers from among the plurality of local sense amplifiers included in the corresponding split region from among the first split region through the nth split region. Advantageously, the first driving voltage may have a magnitude that is directly proportional to a distance between the split region (including the local sense amplifier) from among the first split region through the nth split region, to the GIO sense amplifier. Thus, when the distance between the first split region to the GIO sense amplifier is greater than the distance between the nth split region to the GIO sense amplifier, the first driving voltage of the local sense amplifier in the first split region may be higher than the first driving voltage of the local sense amplifier in the nth split region.

The semiconductor memory device may further include at least two GIO precharge transistors, which are each electrically connected to one end of the corresponding GIO split line from among the first GIO split line through the nth GIO split line, and are turned on in response to a precharge signal. In some embodiments, the GIO precharge transistor may be included in each of the first GIO split line through the nth GIO split line. Moreover, one end of the GIO precharge transistor may be connected to one end of the corresponding connection control transistor from among the first connection control transistor through the n−1th connection control transistor.

The semiconductor memory device may further include at least two GIO auxiliary drivers, which are connected to the corresponding GIO split line from among the first GIO split line through the nth GIO split line, and buffer data to be written by using a second driving voltage. This second driving voltage may be directly proportional to a distance between the split region corresponding to the GIO split line, to which the GIO auxiliary driver is connected (from among the first GIO split line through the nth GIO split line) to the GIO sense amplifier. The GIO auxiliary drivers may respectively be connected to one end of the corresponding connection control transistor from among the first connection control transistor through the n−1th connection control transistor, along with the corresponding GIO split line from among the first GIO split line through the nth GIO split line. The semiconductor memory device may further include: (i) at least two GIO precharge transistors, which precharge the corresponding GIO split line from among the first GIO split line through the nth GIO split line, and (ii) at least two GIO auxiliary drivers, which buffer data to be applied to the corresponding GIO split line from among the first GIO split line through the nth GIO split line.

According to another embodiment of the present invention, there is provided a method of operating a semiconductor memory device including: (i) specifying a split region, which corresponds to an address received from among a plurality of split regions included in a bank, (ii) connecting corresponding GIO split lines to the specified split regions from among a plurality of GIO split lines, (iii) sensing data of memory cells that correspond to the address through the connected GIO split lines, (iv) and amplifying the sensed data to be output as read data. The sensing of data from the memory cells that correspond to the address may further include applying each different first driving voltages of local sense amplifiers that correspond to the address, in response to the number of connected GIO split lines. The method may further include separately precharging each of the plurality of GIO split lines.

According to a further embodiment of the present invention, a dynamic random access memory (DRAM) is provided, which includes: (i) a memory cell region, which is formed on a first substrate and includes a plurality of split regions and a plurality of GIO split lines corresponding to the plurality of split regions, and (ii) a peripheral circuit region, which is formed on a second substrate and include a plurality of connection control transistors for connecting or splitting the plurality of GIO split lines, in response to the received address. The first substrate may be stacked on and overlap the second substrate in a vertical direction in some embodiments.

In addition, a driving voltage may be differently applied to the corresponding split region from among the plurality of split regions for sensing (i.e., reading) or writing data, in response to the number of connected GIO split lines from among the plurality of GIO split lines. The peripheral circuit region may further include: (i) at least two GIO precharge transistors, which are connected to the corresponding GIO split line from among the plurality of GIO split lines and precharge the corresponding GIO split line, and (ii) at least two GIO auxiliary drivers, which are connected to the corresponding GIO split line from among the plurality of GIO split lines and buffer data to be applied to the corresponding GIO split line.

According to still further embodiments of the invention, a semiconductor memory device is provided, which includes a memory bank that is arranged into first through nth split regions containing at least one memory cell sub-array within each split region, where n is a positive integer greater than one. First through nth global input/output (GIO) split lines are provided, which are electrically coupled to the first through nth split regions, respectively. First through n−1th connection control transistors are provided, which have gate terminals responsive to respective connection control signals. The first connection control transistor is configured to electrically short the first and second GIO split lines together when enabled by a corresponding connection control signal, whereas the n−1th connection control transistor is configured to electrically short the n−1th and nth GIO split lines together when enabled by a corresponding connection control signal. A GIO sense amplifier is provided, which is electrically coupled to the memory bank. A control circuit is provided, which is configured to reduce power consumption within the memory device during an operation to transfer read data from a selected one of the memory cell sub-arrays to the GIO sense amplifier, by selectively driving the connection control signals provided to the second through n−1th connection control transistors such that only a subset of the first through nth GIO split lines are electrically coupled together in series when the read data is from the second through nth split regions. The control circuit is further configured to drive all of the connection control signals provided to the first through nth connection control transistors at active levels when the read data is from the first split region and all the first through nth GIO split lines are electrically coupled together in series.

In some embodiments, each of the first through nth split regions includes a corresponding plurality of memory cell sub-arrays therein, which are electrically coupled to a corresponding plurality of local sense amplifiers. A row decoder is also provided, which is electrically coupled to sub word line drivers within the first through nth split regions. In some embodiments, the first connection control transistor extends between the first and second split regions, and the n−1th connection control transistor extends between the n−1th and nth split regions. The plurality of local sense amplifiers within the first split region may also be electrically coupled to the first GIO split line, and the plurality of local sense amplifiers within the nth split region may be electrically coupled to the nth GIO split line.

According to further embodiments, first through n−1th GIO precharge transistors are provided, which include first current carrying terminals electrically coupled to corresponding current carrying terminals of the first through n−1th connection control transistors, and second current carrying terminals responsive to a global precharge voltage. The control circuit may be further configured to reduce power consumption within the memory device during an operation to transfer write data to any one of second through nth split regions, by selectively driving the connection control signals such that the first and second GIO split lines are electrically disconnected from each other.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS

Hereinafter, embodiments of the present invention may be described in detail and to such an extent that one of ordinary skill in the art may implement the present invention.

Figure 1:
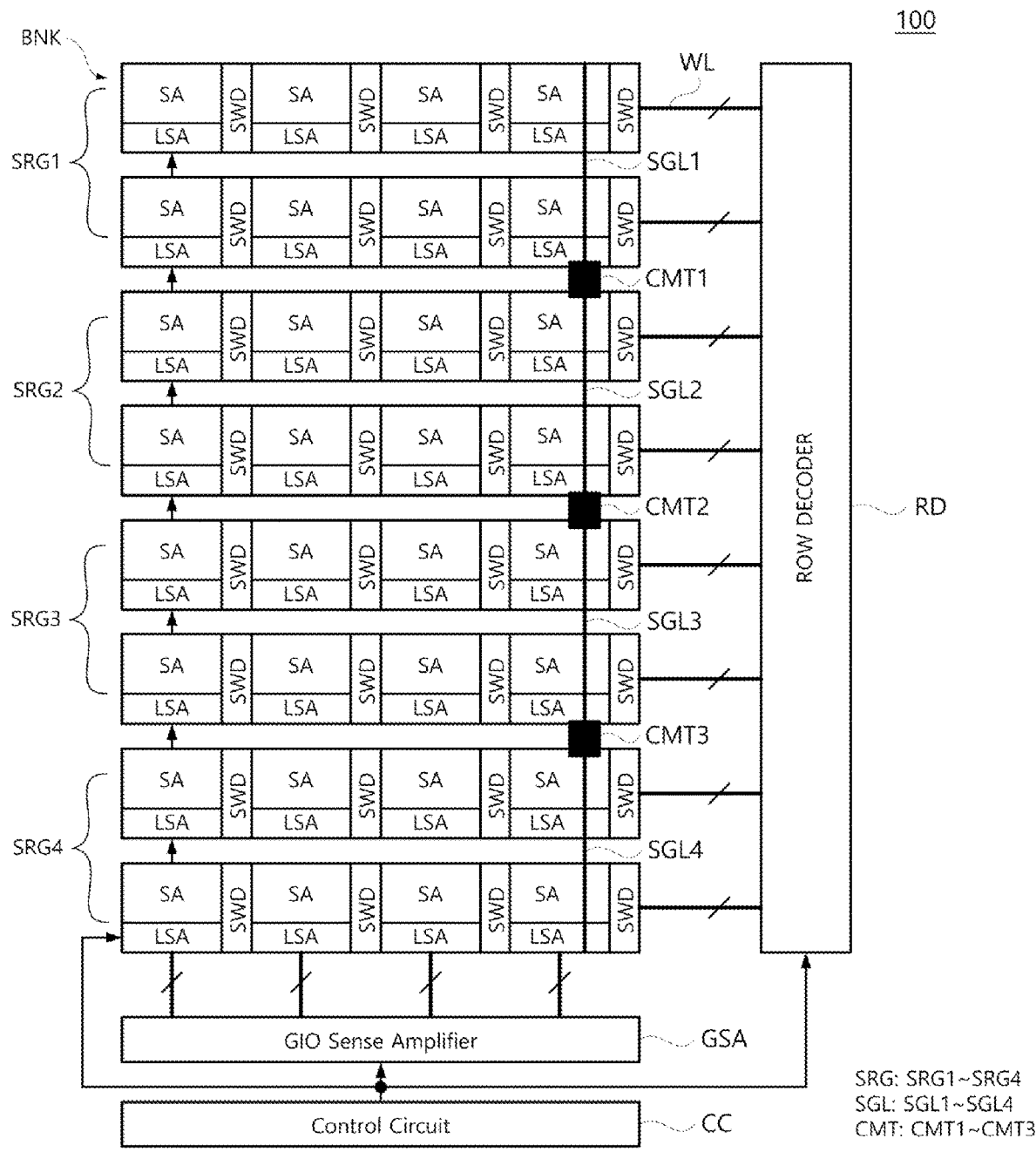
FIG. 1 illustrates a block diagram of a semiconductor memory device according to an embodiment of the present invention.
Figure 2:
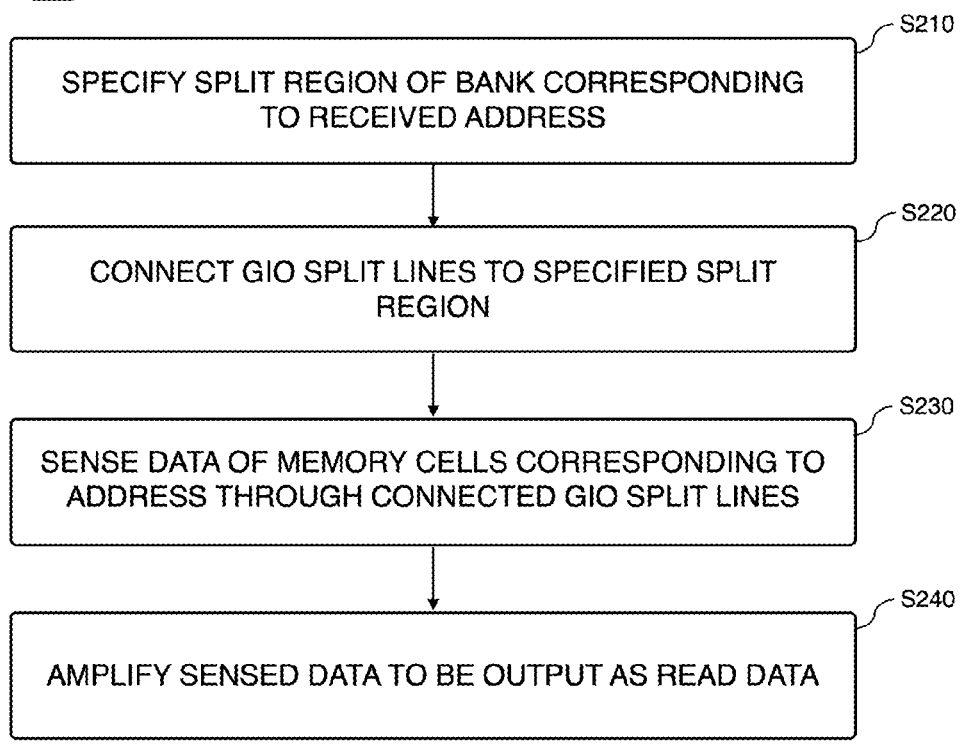
FIG. 2 is a flowchart of operations, which highlight a method of operating a semiconductor memory device according to an embodiment of the present invention.

FIG. 1 illustrates a semiconductor memory device 100 according to an embodiment of the present invention and FIG. 2 is a flowchart illustrating a method 200 of operating a semiconductor memory device according to an embodiment of the present invention. Referring to FIGS. 1 and 2, the semiconductor memory device 100 according to an embodiment of the present invention includes a bank BNK, which is split into n split regions SRGs, n−1 connection control transistors CMTs, and n global input/output (GIO) split lines SGLs, a GIO sense amplifier GSA, a row decoder RD, and a control circuit CC, which generates signals to control operation of the other components of FIG. 1. Here, as only the minimum number of required GIO split lines SGLs is connected, as needed, many adverse effects resulting from the unnecessary additional loading of the GIO lines may be reduced.

FIG. 1 illustrates that n is 4, however, the present invention is not limited thereto. The bank BNK may be controlled by being split into various numbers of split regions SRGs based on operating characteristics required to the semiconductor memory device 100 according to an embodiment of the present invention, such as a load or write/read speed caused or occurred in data input and output. In this regard, the number of the connection control transistors CMTs and the GIO split lines SGLs may each correspond to the number of the split regions SRGs.

The method 200 of operating a semiconductor memory device according to an embodiment of the present invention includes specifying a split region that corresponds to an address received from among a plurality of split regions included in a bank in operation S210, connecting corresponding GIO split lines to the specified split region from among a plurality of GIO split lines in operation S220, sensing data of memory cells that correspond to the address through the connected GIO split lines in operation S230, and amplifying the sensed data to be output as read data in operation S240. Here, as only the minimum number of the GIO split lines corresponding to the received address are connected, adverse effects caused by additional loading of the GIO lines may be reduced.

In the method 200 of operating a semiconductor memory device according to an embodiment of the present invention, the address may be received along with a write instruction, a read instruction, or a precharge instruction, for example. FIG. 2 illustrates the operating method corresponding to a read instruction and an operating method relating to the other instruction according to an embodiment of the present invention will be described later.

Hereinafter, it is described that the semiconductor memory device 100 according to an embodiment of the present invention is operated by using the method 200 of operating a semiconductor memory device according to an embodiment of the present invention, and the method 200 of operating the semiconductor memory device according to an embodiment of the present invention is executed in the semiconductor memory device 100 according to an embodiment of the present invention. However, the present invention is not limited thereto. The semiconductor memory device 100 according to an embodiment of the present invention may be operated by using a method different from the method 200 of operating a semiconductor memory device according to an embodiment of the present invention. Also, the method 200 of operating a semiconductor memory device according to an embodiment of the present invention may be executed in a semiconductor memory device different from the semiconductor memory device 100 according to an embodiment of the present invention.

Referring again to FIG. 1, the bank BNK of the semiconductor memory device 100 according to an embodiment of the present invention is partitioned into a first split region SRG1, a second split region SRG2, a third split region SRG3, and a fourth split region SRG4. Thus, FIG. 1 illustrates that the bank BNK includes four split regions SRGs, however, the split numbers may vary as described above. The first split region SRG1 through the fourth split region SRG4 each include a plurality of sub-arrays SAs. The semiconductor memory device 100 may include a plurality of banks BNKs of FIG. 1. Here, the banks BNKs may be defined in various units. For example, in the addresses formed of a rank address, a bank address, a row address, and a column address, the banks BNKs may be defined by the bank address. Alternatively, the banks BNKs may be internally divided and operated for the same bank address. However, it is described hereinafter that each of the banks BNKs includes the plurality of sub-arrays SAs shared by one GIO sense amplifier.

Figure 3:
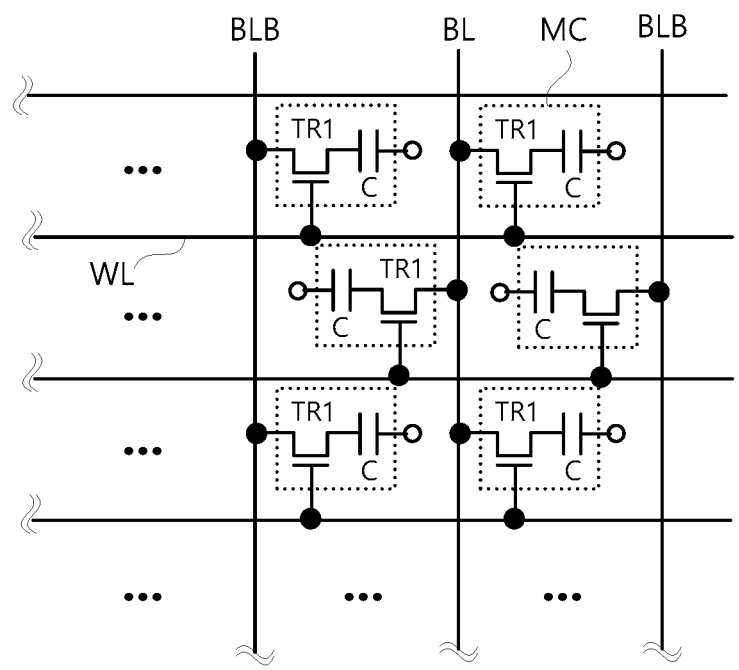
FIG. 3 illustrates an example of a memory cell sub-array of FIG. 1.

FIG. 3 illustrates an example of the sub-array SA of FIG. 1. Referring to FIGS. 1-3, the semiconductor memory device 100 according to an embodiment of the present invention may be a dynamic random access memory (DRAM). Here, the plurality of sub-arrays SAs each includes a plurality of memory cells MCs of FIG. 3. The memory cells MCs may each include a first transistor TR1 and a capacitor C. The first transistor TR1 includes one end connected to a bit line BL (or a "complementary" bit line bar BLB) and a gate connected to a word line WL. The capacitor C may include one end connected to the other end of the first transistor TR1.

In another example, the memory cells MCs may not include the capacitor C or may further include another semiconductor device. Also, when the semiconductor memory device 100 according to an embodiment of the present invention is a vertical cell transistor (VCT) DRAM, the connection of the first transistor TR1 included in the memory cell MC with regard to the word line WL and the bit line BL may be different from that of FIG. 1. However, hereinafter, unless otherwise noted, the present invention is described based on the structure of the memory cells MCs of FIG. 3. Thus, the first transistor TR1 is a NMOS transistor which may function as a kind of an access transistor. That is, the first transistor TR1 is turned on according to voltages of the bit line BL and the word line WL so that data may be written to the capacitor C or data may be read from the capacitor C during write and read operations, and during memory cell refresh.

For example, the row decoder RD may decode a row address of the address of a read instruction to activate the corresponding word line WL and a column decoder (not illustrated), which may be interposed between the bank BNK and the GIO sense amplifier GSA, may decode a column address of the address to activate the corresponding bit line BL. The memory cell MC selected as described above may be included in one split region from among the first split region SRG1 through nth split region SRGn. That is, the split region SRG of the bank BNK that corresponds to the address is specified in operation S210.

A sub word line driver SWD may raise the voltage of the word line WL activated by the row decoder RD. A local sense amplifier LSA may sense and amplify a voltage difference between the bit line BL and the bit line bar BLB which corresponds to the memory cell MC of the activated word line. The local sense amplifier LSA may be connected to a corresponding GIO split line from among a first GIO split line SGL1 through a fourth GIO split line SGL4. Here, each of the first GIO split line SGL1 through the fourth GIO split line SGL4 is illustrated as a single line. However, unless otherwise noted, it should be understood that the first GIO split line SGL1 through the fourth GIO split line SGL4 correspond to pairs of GIO split lines consisting of true and complementary GIO split lines.

Among the first GIO split line SGL1 through the fourth GIO split line SGL4, the GIO split line corresponding to the split region adjacent to the GIO sense amplifier GSA and the GIO split line connected to the local sense amplifier LSA for the memory cell MC indicated by the address are connected to each other in operation S220. For example, when the GIO split line corresponding to the split region adjacent to the GIO sense amplifier GSA is the fourth GIO split line SGL4 and the split region corresponding to the address of a read instruction is a third split region SRG3, a third GIO split line SGL3 and the fourth GIO split line SGL4 may be connected to each other. Here, the fourth GIO split line SGL4 mat be connected to the GIO sense amplifier GSA.

Accordingly, data of the memory cell MC which is sensed and amplified by the local sense amplifier LSA may be applied to the connected GIO split line from among the first GIO split line SGL1 through the fourth GIO split line SGL4 and the voltage of the connected GIO split line may be transmitted to the GIO sense amplifier GSA. The GIO sense amplifier GSA senses the voltage of the connected GIO split line in operation S230 and the sensed data is amplified to be output as read data in operation S240.

Figure 4:
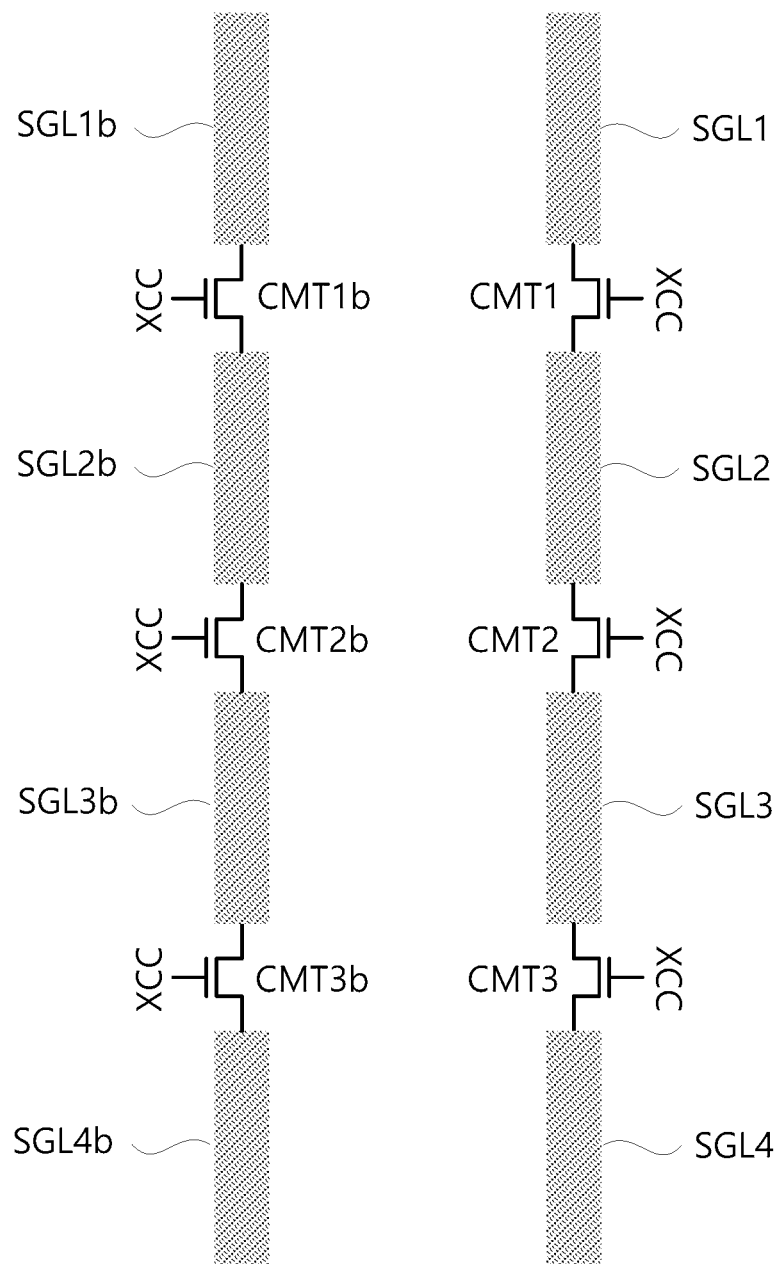
FIG. 4 illustrates global input/output (GIO) split lines, which are connected by connection control transistors according to an embodiment of the present invention.

FIG. 4 illustrates the GIO split lines connected by the connection control transistors according to an embodiment of the present invention. Referring to FIGS. 1 and 4, a first connection control transistor CMT1 through a third connection control transistor CMT3 are each shared by an adjacent split region from among the first split region SRG1 through the fourth split region SRG4. For example, the first connection control transistor CMT1 may be shared by the first split region SRG1 and a second split region SRG2, a second connection control transistor CMT2 may be shared by the second split region SRG2 and the third split region SRG3, and the third connection control transistor CMT3 may be shared by third split region SRG3 and the fourth split region SRG4. Accordingly, the number of the connection control transistors CMTs may be smaller than the number of the split regions SRGs in the bank BNK by one (1).

The first GIO split line SGL1 through the fourth GIO split line SGL4 may each correspond to the split regions SRGs of the bank BNK. That is, the first GIO split line SGL1 through the fourth GIO split line SGL4 may be connected to the local sense amplifier LSA of the corresponding split region from among the first split region SRG1 through the fourth split region SRG4 so that reading operation, writing operation, and precharging operation may be performed for the sub-array SA in the corresponding split region. For example, the first GIO split line SGL1 may correspond to the first split region SRG1 and the second GIO split line SGL2 may correspond to the second split region SRG2. Similarly, the third GIO split line SGL3 may correspond to the third split region SRG3 and the fourth GIO split line SGL4 may correspond to the fourth split region SRG4.

The first GIO split line SGL1 through the fourth GIO split line SGL4 may be connected to each other when the corresponding connection control transistor is turned on from among the first connection control transistor CMT1 through the third connection control transistor CMT3. For example, the first GIO split line SGL1 and the second GIO split line SGL2 may be connected by the first connection control transistor CMT1, the second GIO split line SGL2 and the third GIO split line SGL3 may be connected by the second connection control transistor CMT2, and the third GIO split line SGL3 and the fourth GIO split line SGL4 may be connected by the third connection control transistor CMT3.

The first GIO split line SGL1 through the fourth GIO split line SGL4 may each make a pair with a corresponding complementary GIO split line. That is, the first GIO split line SGL1 may make a pair with a first complementary GIO split line SGL1$b$ and the second GIO split line SGL2 may make a pair with a second complementary GIO split line SGL2$b$. Similarly, the third GIO split line SGL3 may make a pair with a third complementary GIO split line SGL3$b$ and the fourth GIO split line SGL4 may make a pair with a fourth complementary GIO split line SGL4$b$. Accordingly, the first complementary GIO split line SGL1$b$ may correspond to the first split region SRG1 and the second complementary GIO split line SGL2$b$ may correspond to the second split region SRG2. Similarly, the third complementary GIO split line SGL3$b$ may correspond to the third split region SRG3 and the fourth complementary GIO split line SGL4$b$ may correspond to the fourth split region SRG4.

The first connection control transistor CMT1 through the third connection control transistor CMT3 are each turned on, in response to a connection control signal XCC and may connect two adjacent GIO split lines. The connection control signal XCC may be generated in response to an address, such as a row address. For example, when the address indicates the sub-array SA of the third split region SRG3, the connection control signal XCC may be generated for the third connection control transistor CMT3 to be turned on from among the first connection control transistor CMT1 through the third connection control transistor CMT3. A first complementary connection control transistor CMT1$b$ through a third complementary connection control transistor CMT3$b$ for controlling connection of the first complementary GIO split line SGL1$b$ through the fourth complementary GIO split line SGL4$b$ may be controlled in the same manner as in the first connection control transistor CMT1 through the third connection control transistor CMT3.

As above, it is described that the connection of the first GIO split line SGL1 through the fourth GIO split line SGL4 and the first complementary GIO split line SGL1$b$ through the fourth complementary GIO split line SGL4$b$ is controlled by the first connection control transistor CMT1 through the third connection control transistor CMT3 and the first complementary connection control transistor CMT1$b$ through the third complementary connection control transistor CMT3$b$. However, the present invention is not limited thereto, and the connection may be controlled by switching members other than the transistors.

In the semiconductor memory device 100 according to an embodiment of the present invention, the GIO line is split into the first GIO split line SGL1 through the fourth GIO split line SGL4 and the connection thereof is controlled by the first connection control transistor CMT1 through the third connection control transistor CMT3 so that a load of the GIO line may be minimized during operation. For example, when a reading operation is performed for the sub-array SA of the third split region SRG3, the GIO line may not be formed to the first split region SRG1. Accordingly, an average load of the GIO line for a certain time or for a certain operation may be reduced and thus, power consumption or characteristic degradation of the semiconductor memory device occurring due to a load of the GIO line may be prevented.

Figure 5:
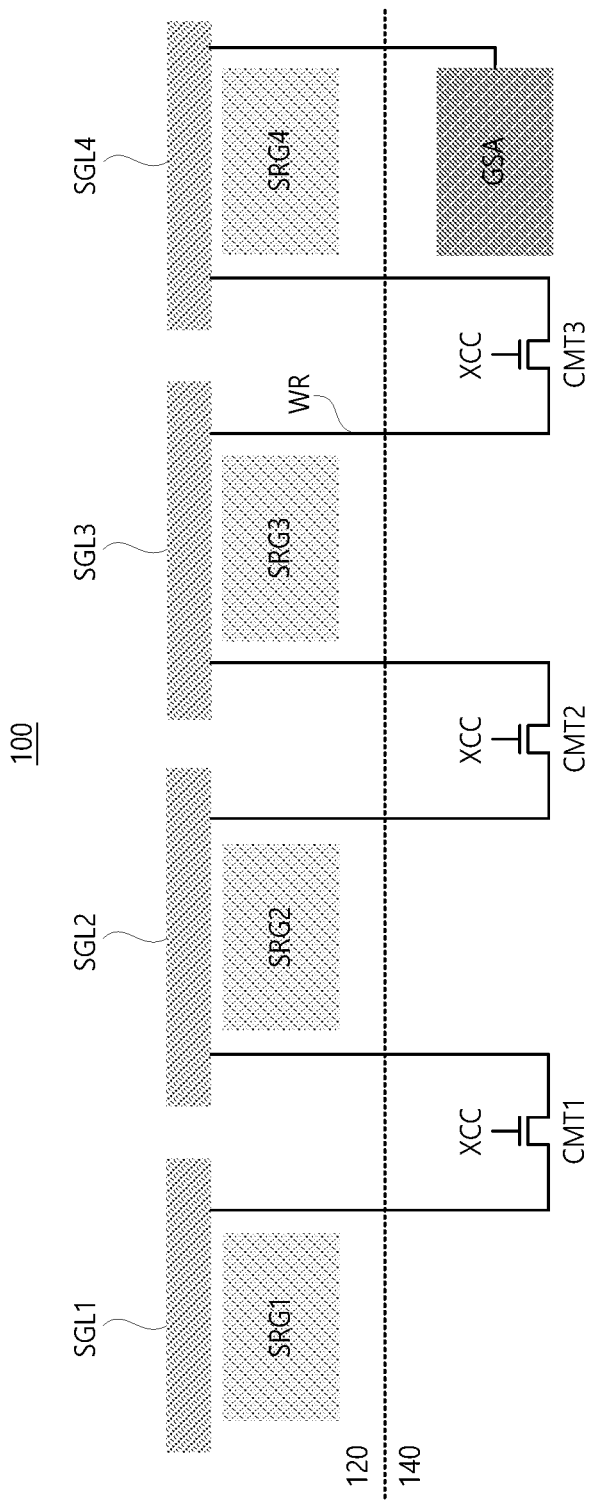
FIG. 5 illustrates positions of connection control transistors according to an embodiment of the present invention.

FIG. 5 illustrates positions of the connection control transistors according to an embodiment of the present invention. Referring to FIGS. 1 and 5, the semiconductor memory device according to an embodiment of the present invention may include a memory cell region 120 and a peripheral circuit region 140. The memory cell region 120 may be stacked on and overlap the peripheral circuit region 140 in a first direction. Here, the first direction may be a vertical direction. The memory cell region 120 may include at least one bank BNK, that is, the plurality of sub-arrays SAs.

The peripheral circuit region 140 may include the first connection control transistor CMT1 through the third connection control transistor CMT3. The first connection control transistor CMT1 through the third connection control transistor CMT3 disposed in the peripheral circuit region 140 may be connected to the first GIO split line SGL1 through the fourth GIO split line SGL4 disposed in the memory cell region 120 by using a wiring WR. Accordingly, in the semiconductor memory device according to an embodiment of the present invention, a load of the GIO line may be dispersed or reduced without increasing an area. Also, although not illustrated in FIG. 5, the local sense amplifier LSA may also be disposed in the peripheral circuit region 140.

As described above, the fourth GIO split line SGL4 may include one end connected to the third connection control transistor CMT3 and the other end connected to the sense amplifier GSA. Similarly, the GIO sense amplifier GSA disposed in the peripheral circuit region 140 may be connected to the fourth GIO split line SGL4 disposed in the memory cell region 120 through the wiring WR.

Figure 6:
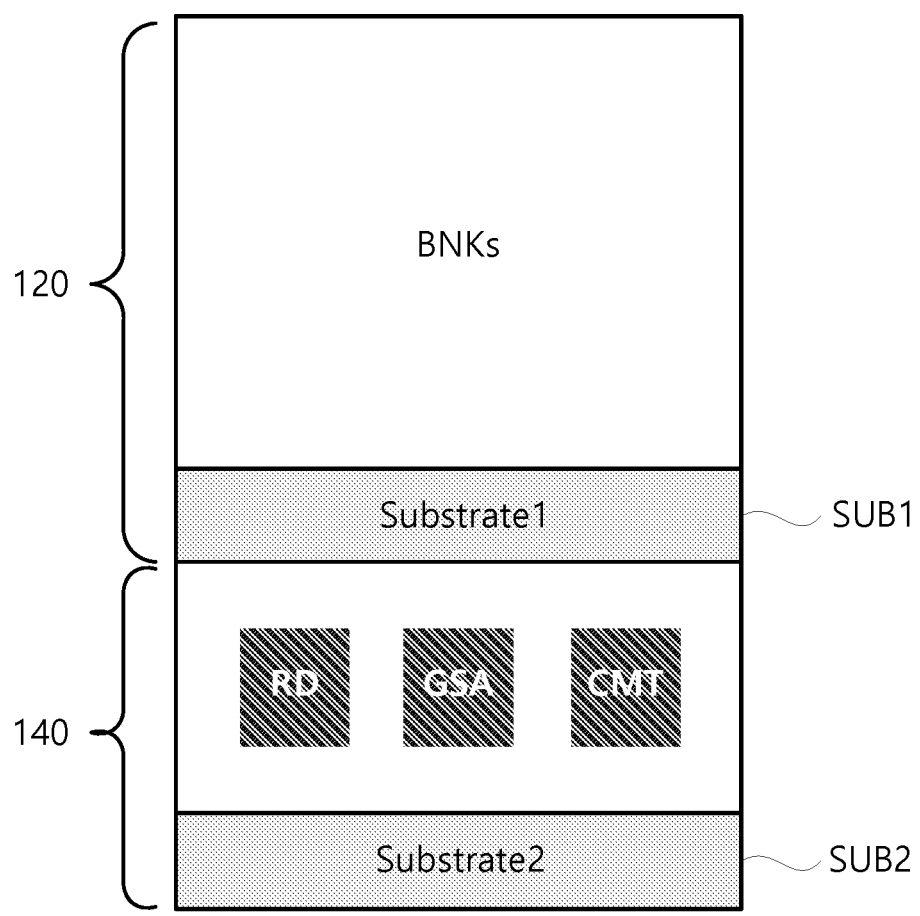
FIG. 6 illustrates a semiconductor memory device having a cell on periphery (COP) structure according to an embodiment of the present invention.

FIG. 6 illustrates the semiconductor memory device 100 having a cell on periphery (COP) structure according to an embodiment of the present invention. Referring to FIG. 6, the semiconductor memory device 100 according to an embodiment of the present invention may have a COP structure. For example, the memory cell region 120 is formed on a first substrate SUB1 and the peripheral circuit region 140 is formed on a second substrate SUB2, wherein the first substrate SUB1 is stacked on and overlaps the second substrate SUB2 in a vertical direction. Here, the first substrate SUB1 may be disposed at the upper part of the second substrate SUB2 in a vertical direction. However, the present invention is not limited thereto, and the second substrate SUB2 may be disposed at the upper part of the first substrate SUB1 in a vertical direction based on operating characteristics or process characteristics.

Figure 7:
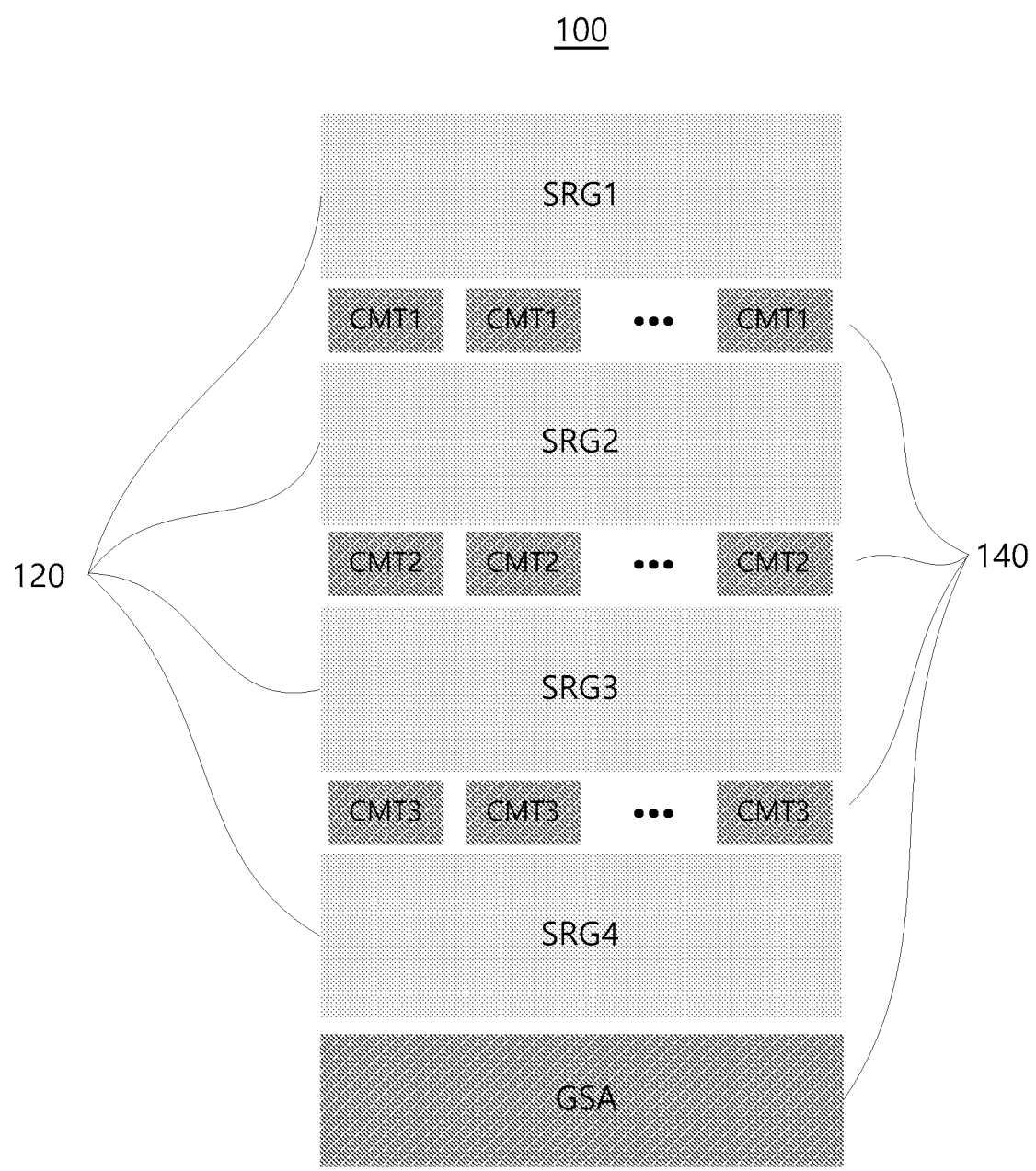
FIG. 7 illustrates positions of connection control transistors according to another embodiment of the present invention.

FIG. 7 illustrates positions of the connection control transistors according to another embodiment of the present invention. Referring to FIG. 7, in the semiconductor memory device 100 according to an embodiment of the present invention, the memory cell region 120 and the peripheral circuit region 140 may be formed on a same substrate in contrast to FIG. 5 or FIG. 6, which illustrates that the memory cell region 120 is stacked on and overlaps the peripheral circuit region 140 in a vertical direction. Here, the first connection control transistor CMT1 through the third connection control transistor CMT3 may be interposed between shared split regions from among the first split region SRG1 through the fourth split region SRG4. Accordingly, in the semiconductor memory device 100 according to an embodiment of the present invention, a load of the GIO line may be dispersed or reduced regardless of its structure.

Figure 8:
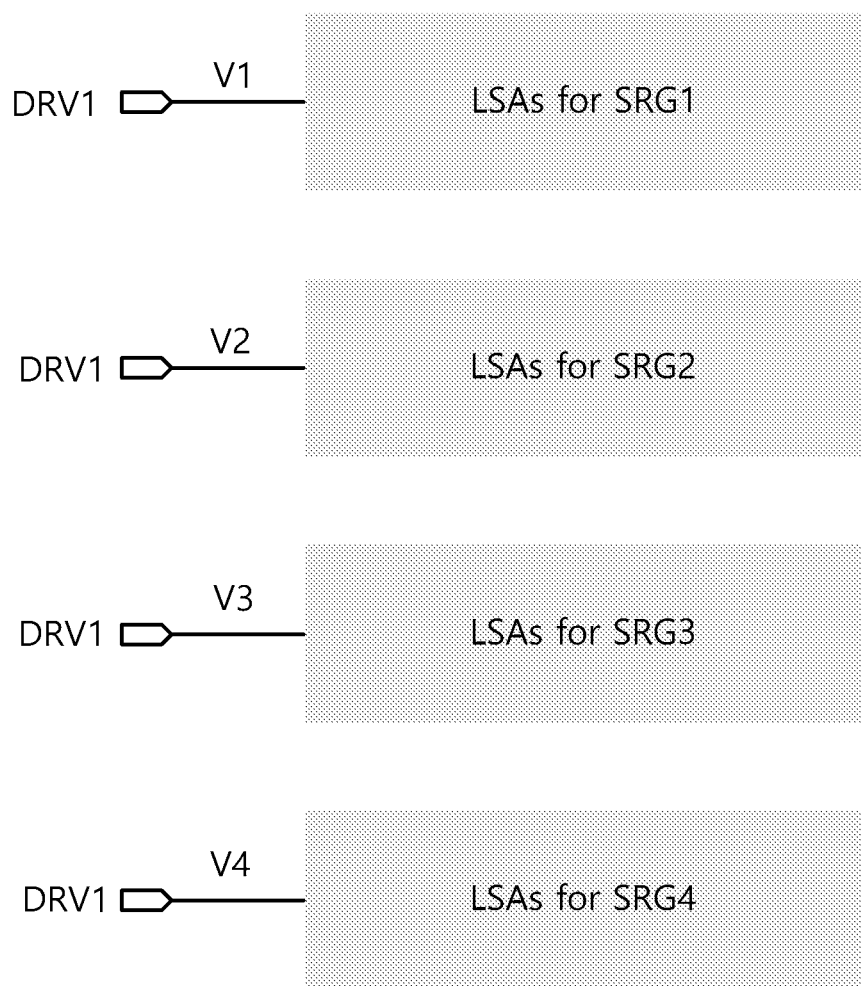
FIGS. 8 and 9 respectively illustrate a first driving voltage of a local sense amplifier according to an embodiment of the present invention.
Figure 9:
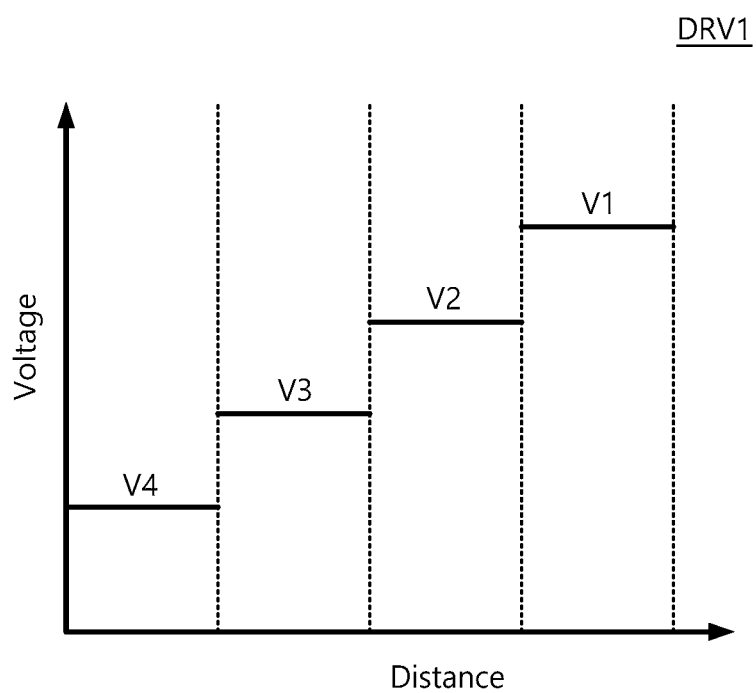

FIGS. 8 and 9 respectively illustrate a first driving voltage DRV1 of the local sense amplifier LSA according to an embodiment of the present invention. Referring to FIGS. 1, 8, and 9, the first driving voltage DRV1 may be used by the local sense amplifier LSA to perform the sensing and amplifying operations. In the semiconductor memory device 100 according to an embodiment of the present invention, the applied first driving voltage DRV1 of the local sense amplifier LSA may vary in response to the number of connected GIO split lines.

The connection between the first GIO split line SGL1 through the fourth GIO split line SGL4 may vary according to the split regions, which correspond to the row address. For example, when the row address indicates the first split region SRG1, the first GIO split line SGL1 through the fourth GIO split line SGL4 are connected to each other. But, when the row address indicates the second split region SRG2, the second GIO split line SGL2 through the fourth GIO split line SGL4 are connected to each other. And, when the row address indicates the third split region SRG3, the third GIO split line SGL3 and the fourth GIO split line SGL4 may be connected to each other. Finally, when the row address indicates the fourth split region SRG4, the fourth GIO split line SGL4 may be activated, but without connecting to other GIO split lines (SGL1-SGL3) in order to reduce power consumption associated with charging and/or discharging the other GIO split lines.

Here, the first driving voltage DRV1 of the local sense amplifier LSA connected to the fourth GIO split line SGL4, when the fourth GIO split line SGL4 is only activated, may have a lower level than that of the first driving voltage DRV1 of the local sense amplifier LSA connected to the second GIO split line SGL2, when the second GIO split line SGL2 through the fourth GIO split line SGL4 are connected to each other. Also, the first driving voltage DRV1 of the local sense amplifier LSA connected to the second GIO split line SGL2, when the second GIO split line SGL2 through the fourth GIO split line SGL4 are connected to each other, may have a lower level than that of the first driving voltage DRV1 of the local sense amplifier LSA connected to the first GIO split line SGL1, when the first GIO split line SGL1 through the fourth GIO split line SGL4 are all connected to each other.

At another point, a level of the applied first driving voltage DRV1 in the local sense amplifier LSA may vary according to the corresponding split region from among the first split region SRG1 through the fourth split region SRG4. For example, the first driving voltage DRV1 may be proportional to a distance spaced apart from the split region from among the first split region SRG1 through the fourth split region SRG4 to the GIO sense amplifier GSA, wherein in the split region, the local sense amplifier LSA performs the sensing and amplifying operations.

FIG. 1 illustrates that a distance spaced apart from the first split region SRG1 to the GIO sense amplifier GSA is greater than a distance spaced apart from the fourth split region SRG4 to the GIO sense amplifier GSA. That is, the distance from the GIO sense amplifier GSA to the split region increases from the fourth split region SRG4 to the first split region SRG1. Here, the first driving voltage DRV1 of the local sense amplifier LSA in the first split region SRG1 may be higher than the first driving voltage DRV1 of the local sense amplifier LSA in the fourth split region SRG4.

For example, the first driving voltage DRV1 of the local sense amplifier LSA in the first split region SRG1 may have the voltage level of "V1", the first driving voltage DRV1 of the local sense amplifier LSA in the second split region SRG2 may have the voltage level of "V2", the first driving voltage DRV1 of the local sense amplifier LSA in the third split region SRG3 may have the voltage level of "V3", and the first driving voltage DRV1 of the local sense amplifier LSA in the fourth split region SRG4 may have the voltage level of "V4". Here, "V1" may be set to be greater than "V2", "V2" may be set to be greater than "V3", and "V3" may be set to be greater than "V4".

As above, in the semiconductor memory device 100 according to an embodiment of the present invention, the voltage level of the first driving voltages DRV1 varies directly according to the distance spaced apart from the corresponding split region to the GIO sense amplifier GSA while performing the sensing and amplifying operations by the local sense amplifier LSA. Accordingly, the sensed and amplified voltage may be accurately transmitted to the GIO sense amplifier GSA through the connected GIO split line. Therefore, operating reliability of the semiconductor memory device 100 according to an embodiment of the present invention may be improved.

FIG. 8 illustrates that the first driving voltage DRV1 is applied to the local sense amplifier LSA for the corresponding split region from among the first split region SRG1 through the fourth split region SRG4 by using a separate power line. However, the present invention is not limited thereto. The first driving voltage DRV1 may be applied to the local sense amplifier LSA for the corresponding split region from among the first split region SRG1 through the fourth split region SRG4 by using a common power line or the voltage level of the applied first driving voltage DRV1 may vary in response to a row address.

Figure 10:
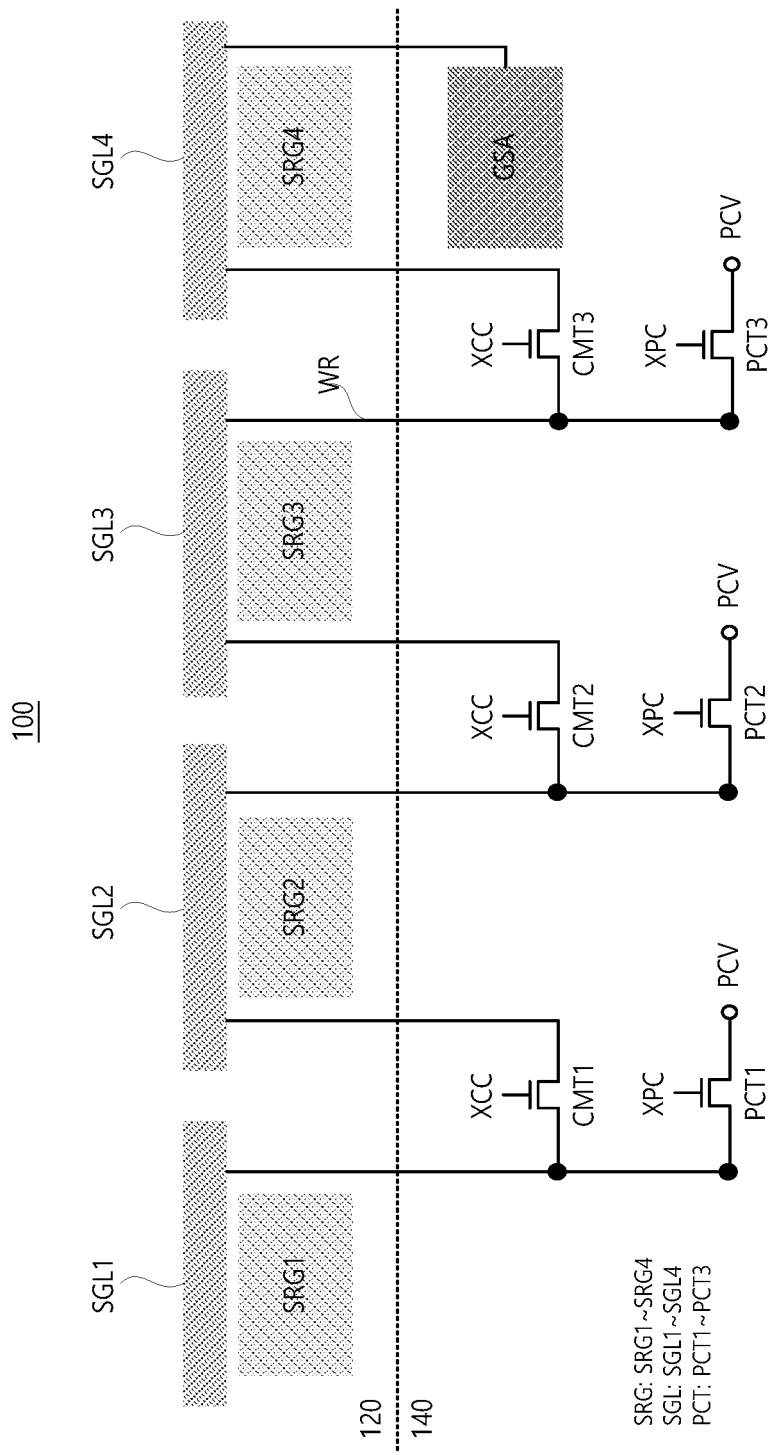
FIG. 10 illustrates a semiconductor memory device in which precharging is separately performed for the GIO split lines according to an embodiment of the present invention.
Figure 11:
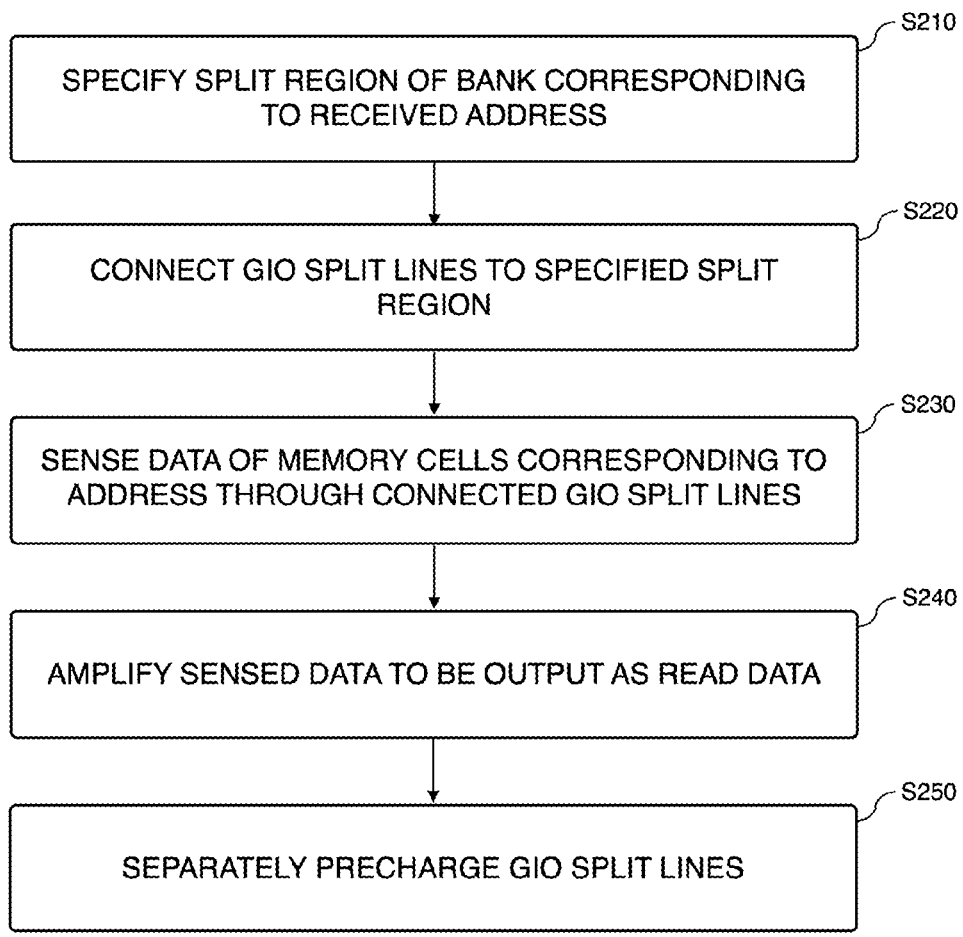
FIG. 11 is a flowchart of operations, which illustrate a method of operating a semiconductor memory device relating to precharging according to an embodiment of the present invention.

FIG. 10 illustrates the semiconductor memory device 100 in which precharging is separately performed for the GIO split lines according to an embodiment of the present invention, and FIG. 11 is a flowchart illustrating a method of operating the semiconductor memory device 100 relating to the precharging according to an embodiment of the present invention. Referring now to FIGS. 10 and 11, in the semiconductor memory device 100 according to an embodiment of the present invention, precharging may be separately performed for each of the first GIO split line SGL1 through the fourth GIO split line SGL4 in operation S250 after the reading operation is completed in operations S210 to S240. In this regard, the semiconductor memory device 100 according to an embodiment of the present invention may include at least two GIO precharge transistors PCTs. The GIO precharge transistors PCT may be connected to one end of the corresponding GIO split line from among the first GIO split line SGL1 through the fourth GIO split line SGL4, may be turned on in response to a precharge signal XPC, and may apply a global precharge voltage PCV to the corresponding GIO split line.

The GIO precharge transistor PCT may be connected to a corresponding GIO split line among the first GIO split line SGL1 through the fourth GIO split line SGL4. For example, a first GIO precharge transistor PCT1 may be connected to one end of the first GIO split line SGL1, the second GIO precharge transistor PCT2 may be connected to one end of the second GIO split line SGL2, and the third GIO precharge transistor PCT3 may be connected to one end of the third GIO split line SGL3.

Also, the first GIO precharge transistor PCT1 through the third GIO precharge transistor PCT3 may be respectively connected to one ends of the first connection control transistor CMT1 through the third connection control transistor CMT3. FIG. 10 illustrates that the memory cell region 120 is stacked on and overlaps the peripheral circuit region 140 in a vertical direction. However, the present invention is not limited thereto. Similar to FIG. 7, the memory cell region 120 and the peripheral circuit region 140 may be formed on the same substrate for the structure and operation for separately performing precharging of the first GIO split line SGL1 through the fourth GIO split line SGL4.

Figure 12:
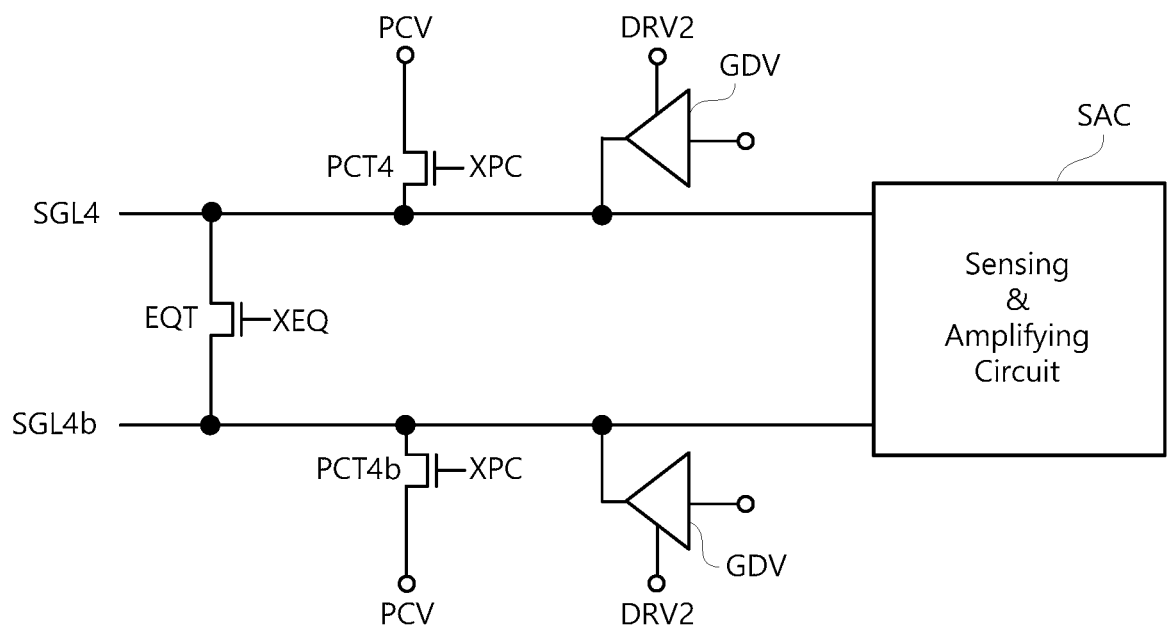
FIG. 12 illustrates a GIO sense amplifier according to an embodiment of the present invention.

FIG. 12 illustrates the GIO sense amplifier GSA according to an embodiment of the present invention. Referring to FIGS. 10 through 12, the GIO sense amplifier GSA according to an embodiment of the present invention may include a fourth GIO precharge transistor PCT4 and a fourth complementary GIO precharge transistor PCT4b along with a sensing and amplifying circuit SAC which performs sensing and amplifying operations when reading operation is performed. The fourth GIO precharge transistor PCT4 may be connected to one end of the fourth GIO split line SGL4 and the fourth complementary GIO split line SGL4b may be connected to one end of the fourth complementary GIO precharge transistor PCT4b. Although not illustrated in FIG. 10, transistors may be further included in the complementary GIO split lines that correspond to the first GIO split line SGL1 through the third GIO split line SGL3 for precharging each of the corresponding complementary GIO split lines.

As described above, in the semiconductor memory device 100 and the method 200 of operating the same according to an embodiment of the present invention, precharging is performed for each of the plurality of GIO split lines SGLs formed by splitting the GIO line so that precharging to an accurate voltage level may be achieved and/or the time required in precharging may be reduced.

The GIO sense amplifier GSA according to an embodiment of the present invention may further include an equalizing transistor EQT and GIO drivers GDVs. After a pair of GIO split lines, which is connected to a pair of the GIO split lines including the fourth GIO split line SGL4 and the fourth complementary GIO split line SGL4b, is sensed, the equalizing transistor EQT may be used to equalize the pair of connected GIO split lines in response to an equalizing signal XEQ. In response to a write instruction, the GIO driver GDV may apply a voltage corresponding to data to be written to a pair of GIO split lines connected to the pair of GIO split lines including the fourth GIO split line SGL4 and the fourth complementary GIO split line SGL4b. The GIO driver GDV may perform operations described above by using a second driving voltage DRV2.

Figure 13:
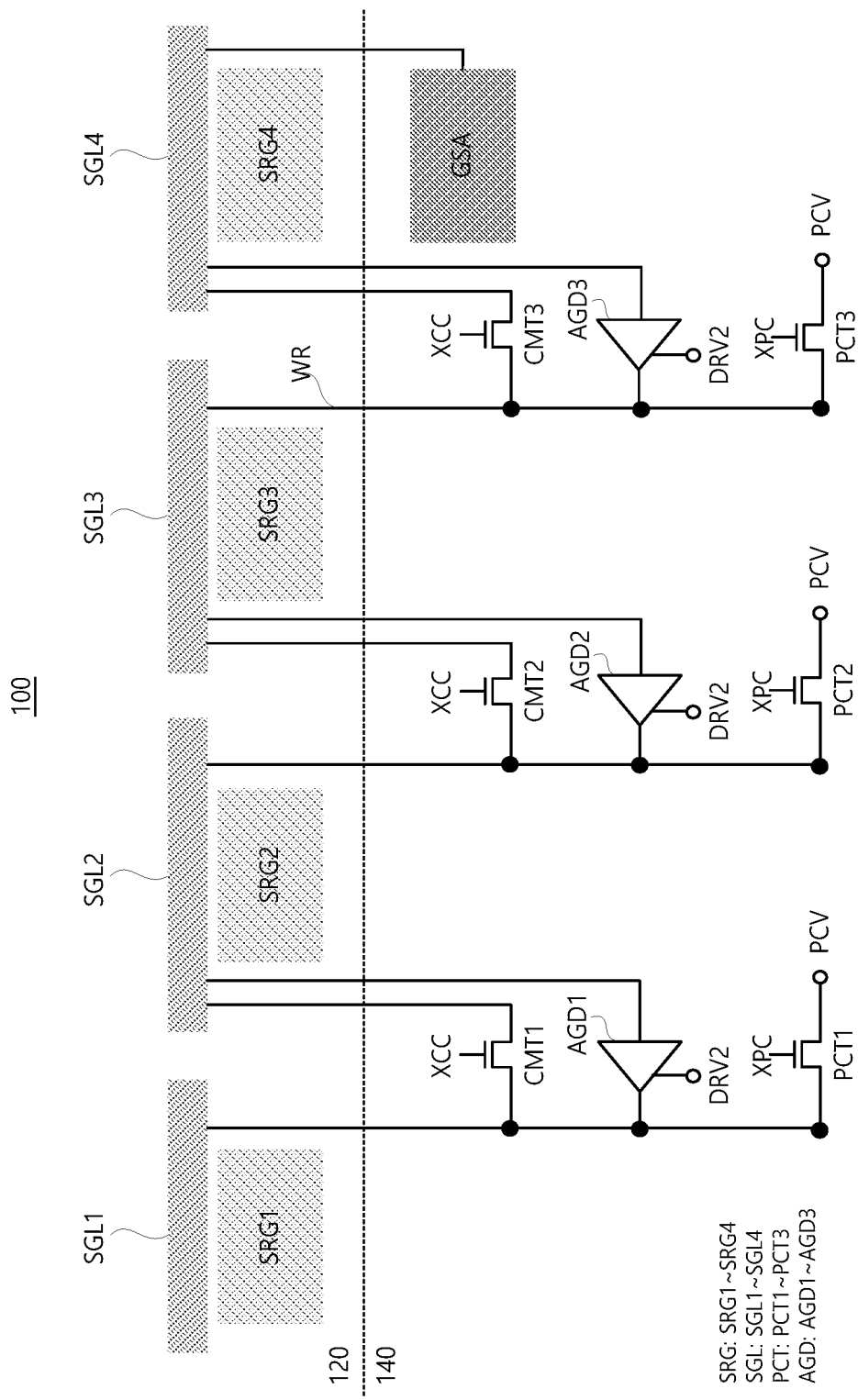
FIG. 13 illustrates a semiconductor memory device including GIO auxiliary drivers according to an embodiment of the present invention.

FIG. 13 illustrates the semiconductor memory device 100 including GIO auxiliary drivers AGDs according to an embodiment of the present invention. Referring now to FIG. 13, the semiconductor memory device 100 according to an embodiment of the present invention may further include at least two GIO auxiliary drivers AGDs. The GIO auxiliary drivers AGDs may buffer data to be written through the corresponding GIO split lines. That is, the GIO auxiliary drivers AGDs may buffer and transmit data from the corresponding GIO split lines from among the first GIO split line SGL1 through the fourth GIO split line SGL4. For example, a first GIO auxiliary driver AGD1 may be connected between the first GIO split line SGL1 and the second GIO split line SGL2, a second GIO auxiliary driver AGD2 may be connected between the second GIO split line SGL2 and the third GIO split line SGL3, and a third GIO auxiliary driver AGD3 may be connected between the third GIO split line SGL3 and the fourth GIO split line SGL4.

The first GIO auxiliary driver AGD1 through the third GIO auxiliary driver AGD3 may each perform the buffering operation by the second driving voltage DRV2. The second driving voltage DRV2 may be the same as the second driving voltage DRV2 of the GIO driver GDV in FIG. 12. However, the voltage levels thereof may be different from each other.

The voltage levels of the second driving voltage DRV2 may be each different according to the number of the connected GIO split lines in the first GIO auxiliary driver AGD1 through the third GIO auxiliary driver AGD3. As described above, the connection between the first GIO split line SGL1 through the fourth GIO split line SGL4 may vary according to the split regions which correspond to the row address. Thus, the second driving voltages DRV2, which are different from each other according to the corresponding split regions from among the first split region SRG1 through the fourth split region SRG4, may be applied to the first GIO auxiliary driver AGD1 through the third GIO auxiliary driver AGD3. For example, the second driving voltage DRV2 may be proportional to a distance spaced apart from the split region, to which data buffered by the GIO auxiliary driver AGD is transmitted, from among the first split region SRG1 through the fourth split region SRG4 to the GIO sense amplifier GSA.

As above, in the semiconductor memory device 100 according to an embodiment of the present invention, the voltage may be prevented from being lowered in the GIO lines while writing of data and thus, operations performed may be more reliable.

Also, the first GIO auxiliary driver AGD1 through the third GIO auxiliary driver AGD3 may be respectively connected to one ends of the first connection control transistor CMT1 through the third connection control transistor CMT3. FIG. 13 illustrates that the memory cell region 120 is stacked on and overlaps the peripheral circuit region 140 in a vertical direction. However, the present invention is not limited thereto. The structure for additionally buffering the voltages of the first GIO split line SGL1 through the fourth GIO split line SGL4 by the GIO driver GDV of FIG. 13 may be formed on a substrate including both the memory cell region 120 and the peripheral circuit region 140 as shown in FIG. 7.

It is illustrated in FIG. 13 that the semiconductor memory device 100 includes both GIO precharge transistors PCTs and the GIO auxiliary drivers AGDs. However, the present invention is not limited thereto and any one of the two may be included according to required operating condition. According to the semiconductor memory device and the method of operating the same in the present invention, a load of the GIO lines is reduced and thereby, power consumption or characteristic degradation occurring due to the load of the GIO lines may be prevented in the semiconductor memory device.

Although representative embodiments of the present invention have been described in detail, those of ordinary skill in the art to which the present invention pertains will understand that various modifications are capable of being made to the above-described embodiments without departing from the scope the present invention. For example, it is described above that the number of the GIO split lines SGLs, the GIO precharge transistors PCTs, and the GIO auxiliary drivers AGDs is the same as the number of the split regions SRGs or smaller than the number of split regions SRGs by one (1). However, the present invention is not limited thereto. Therefore, the scope of the present invention should not be limited to the described embodiments, but it should be defined not only by the claims described below, but also by the claims and legal equivalents.

What is claimed is:

1. A semiconductor memory device, comprising:
a memory bank arranged into first through nth split regions containing at least one memory cell sub-array within each split region, where n is a positive integer greater than one;
first through nth global input/output (GIO) split lines electrically coupled to the first through nth split regions, respectively;
first through n−1th connection control transistors having gate terminals responsive to respective connection control signals, said first connection control transistor configured to electrically short the first and second GIO split lines together when enabled by a corresponding connection control signal, and said n−1th connection control transistor configured to electrically short the n−1th and nth GIO split lines together when enabled by a corresponding connection control signal;
a GIO sense amplifier electrically coupled to said memory bank; and
a control circuit configured to reduce power consumption within the memory device during an operation to transfer read data from a selected one of the memory cell sub-arrays to said GIO sense amplifier, by selectively driving the connection control signals provided to the second through n−1th connection control transistors such that only a subset of the first through nth GIO split lines are electrically coupled together in series when the read data is from the second through nth split regions.

2. The memory device of claim 1, wherein said control circuit is further configured to drive all of the connection control signals provided to the first through nth connection control transistors at active levels when the read data is from the first split region and all the first through nth GIO split lines are electrically coupled together in series.

3. The memory device of claim 1, further comprising first through n−1th GIO precharge transistors having first current carrying terminals electrically coupled to corresponding current carrying terminals of the first through n−1th connection control transistors, and second current carrying terminals responsive to a global precharge voltage.

4. A semiconductor memory device, comprising:
a memory bank split into a first split region through a nth split region comprising a plurality of sub-arrays within each split region;
a first connection control transistor through a n−1th connection control transistor which are shared by an adjacent split region from among the first split region through the nth split region, and are turned on in response to a connection control signal;
a first global input/output (GIO) split line through a nth GIO split line connected to each other by the corresponding connection control transistors from among the first connection control transistor through the n−1th connection control transistor; and
a GIO sense amplifier, which receives and processes data read from a memory cell through the connected GIO split line from among the first GIO split line through the nth GIO split line.

5. The memory device of claim 4, wherein a memory cell region comprising the bank is stacked on and overlaps a peripheral circuit region; and wherein the first connection control transistor through the n−1th connection control transistor are arranged in a first direction.

6. The memory device of claim 5, wherein the memory cell region is formed on a first substrate, the peripheral circuit region is formed on a second substrate, and the first substrate is disposed above the second substrate partially or entirely in the first direction.

7. The memory device of claim 4, wherein the first connection control transistor through the n−1th connection control transistor extend between the adjacent split region from among the first split region through the nth split region.

8. The memory device of claim 4, further comprising:
a plurality of local sense amplifiers for sensing and amplifying data of a corresponding sub-array from among the plurality of sub-arrays by using a first driving voltage, wherein the first GIO split line through the nth GIO split line are each connected to the local sense amplifiers from among the plurality of local sense amplifiers, which sense and amplify the corresponding split region from among the first split region through the nth split region.

9. The memory device of claim 8, wherein the first driving voltage is proportional to a distance spaced apart from the split region, in which the local sense amplifier performs the sensing and amplifying operations, from among the first split region through the nth split region to the GIO sense amplifier.

10. The memory device of claim 4, wherein when the distance spaced apart from the first split region to the GIO sense amplifier is greater than the distance spaced apart from the nth split region to the GIO sense amplifier, the first driving voltage of the local sense amplifier in the first split region is higher than the first driving voltage of the local sense amplifier in the nth split region.

11. The memory device of claim 4, further comprising at least two GIO precharge transistors, each of which is connected to one end of the corresponding GIO split line from among the first GIO split line through the nth GIO split line and is turned on in response to a precharge signal.

12. The memory device of claim 11, wherein a GIO precharge transistor is connected to a corresponding GIO split line among the first GIO split line through the nth GIO split line.

13. The memory device of claim 11, wherein one end of the GIO precharge transistor is connected to one end of the corresponding connection control transistor from among the first connection control transistor through the n−1th connection control transistor.

14. The memory device of claim 4, further comprising:
at least two GIO auxiliary drivers, which are connected to the corresponding GIO split line from among the first GIO split line through the nth GIO split line and buffer data to be written by using a second driving voltage.

15. The memory device of claim 14, wherein a magnitude of the second driving voltage is proportional to a distance spaced apart from the split region corresponding to the GIO split line, to which the GIO auxiliary driver is connected, from among the first GIO split line through the nth GIO split line to the GIO sense amplifier.

16. The memory device of claim 4, wherein the GIO auxiliary drivers are respectively connected to one end of the corresponding connection control transistor from among the first connection control transistor through the n−1th connection control transistor, along with the corresponding GIO split line from among the first GIO split line through the nth GIO split line.

17. The memory device of claim 4, further comprising:
at least two GIO precharge transistors, which precharge the corresponding GIO split line from among the first GIO split line through the nth GIO split line; and
at least two GIO auxiliary drivers, which buffer data to be applied to the corresponding GIO split line from among the first GIO split line through the nth GIO split line.

18. A method of operating a semiconductor memory device, comprising:
specifying a split region that corresponds to an address received from among a plurality of split regions included in a bank;
connecting corresponding GIO split lines to the specified split region from among a plurality of GIO split lines;
sensing data of memory cells that correspond to the address through the connected GIO split lines; and
amplifying the sensed data to be output as read data.

19. The method of claim 18, wherein the sensing data of the memory cells further comprises applying different first driving voltages of local sense amplifiers that correspond to the address, in response to the number of connected GIO split lines.

20. The method of claim 18, further comprising separately precharging each of the plurality of GIO split lines.

* * * * *